(12) United States Patent
Fujita et al.

(10) Patent No.: US 9,006,883 B2
(45) Date of Patent: Apr. 14, 2015

(54) SEMICONDUCTOR MODULE WITH SWITCHING ELEMENTS

(71) Applicant: Denso Corporation, Kariya, Aichi-pref. (JP)

(72) Inventors: Toshihiro Fujita, Obu (JP); Hiroyasu Kidokoro, Kariya (JP); Hiromasa Hayashi, Obu (JP)

(73) Assignee: Denso Corporation, Kariya (JP)

( * ) Notice: Subject to any disclaimer, the term of this patent is extended or adjusted under 35 U.S.C. 154(b) by 196 days.

(21) Appl. No.: 13/774,336

(22) Filed: Feb. 22, 2013

(65) Prior Publication Data

US 2013/0221532 A1    Aug. 29, 2013

(30) Foreign Application Priority Data

Feb. 28, 2012   (JP) ................. 2012-041451

(51) Int. Cl.
*H01L 23/34* (2006.01)
*H01L 23/522* (2006.01)
*H01L 23/00* (2006.01)

(52) U.S. Cl.
CPC ............ *H01L 23/5228* (2013.01); *H01L 24/34* (2013.01); *H01L 2224/48247* (2013.01); *H01L 2924/19107* (2013.01); *H01L 2924/13091* (2013.01); *H01L 2224/0603* (2013.01); *H01L 2224/37147* (2013.01); *H01L 2224/73221* (2013.01); *H01L 2224/40247* (2013.01)

(58) Field of Classification Search
CPC ...... H01L 23/34; H01L 23/5228; H01L 24/34
USPC .................. 257/531, 533, 691, 723–724, 773
See application file for complete search history.

(56) References Cited

U.S. PATENT DOCUMENTS

| 6,531,911 | B1 * | 3/2003 | Hsu et al. ....................... 327/512 |
| 8,592,904 | B2 * | 11/2013 | Shiraishi et al. ............... 257/341 |
| 8,749,939 | B2 * | 6/2014 | Tran et al. ..................... 361/101 |
| 2003/0123522 | A1 * | 7/2003 | Hsu et al. ....................... 374/185 |
| 2008/0023825 | A1 * | 1/2008 | Hebert et al. .................. 257/724 |
| 2008/0135960 | A1 * | 6/2008 | Danno et al. .................. 257/428 |
| 2010/0270958 | A1 | 10/2010 | Tsuboi et al. |

FOREIGN PATENT DOCUMENTS

| JP | 07-226481 | 8/1995 |
| JP | 2001-118701 | 4/2001 |
| JP | 2004-225580 | 8/2004 |
| JP | 2004-343820 | 12/2004 |
| JP | 2007-311582 | 11/2007 |
| JP | 2008-118785 | 5/2008 |
| JP | 2010-254128 | 11/2010 |

\* cited by examiner

*Primary Examiner* — Nathan Ha
(74) *Attorney, Agent, or Firm* — Nixon & Vanderhye PC

(57) ABSTRACT

In a semiconductor module, an upper arm switching element is integrated to a high-potential conductor coupled to a high-potential electrode of a power source, and a lower arm switching element is integrated to a load conductor coupled to a load. A first connecting conductor has a first end connected to the upper arm switching element and a second end connected to the load conductor. A second connecting conductor has a first end connected to the lower arm switching element and a second end connected to a low-potential conductor coupled to a low-potential electrode of the power source. At least one of the first connecting conductor and the second connecting conductor serves as a shunt resistor for detecting an electric current flowing in the at least one.

12 Claims, 11 Drawing Sheets

SEMICONDUCTOR MODULE WITH SWITCHING ELEMENTS

CROSS REFERENCE TO RELATED APPLICATION

This application is based on Japanese Patent Application No. 2012-41451 filed on Feb. 28, 2012, the disclosure of which is incorporated herein by reference.

TECHNICAL FIELD

The present disclosure relates to a semiconductor module in which multiple semiconductor switching elements are integrated.

BACKGROUND

Conventionally, a semiconductor module having semiconductor switching elements has been known. The semiconductor elements constitute a bridge circuit such as a three-phase inverter circuit. In regard to such a bridge circuit, it has been known to arrange a shunt resistor between the switching element of a lower arm part and a ground for detecting an electric current supplied to a load. For example, the shunt resistor is made of a metallic low-resistance material, as described in JP2001-118701A.

Conventionally, the shunt resistor has been used for detecting the electric current, and has been provided as a separate member from a conductor, such as a lead frame, that forms a driving current path of the bridge circuit. In a semiconductor module where a connecting conductor for connecting the switching element and the lead frame and the shunt resistor for detecting an electric current between the switching element and the lead frame are both required, two separate members are used. In such a case, however, the number of components and the number of wiring portions are likely to increase.

SUMMARY

It is an object of the present disclosure to provide a semiconductor module having semiconductor switching elements and a shunt resistor, which is capable of reducing the number of components and the number of wiring portions.

According to an aspect of the present disclosure, a semiconductor module includes an upper arm switching element providing an upper arm part of a bridge circuit, and a lower arm switching element providing a lower arm part of the bridge circuit. The semiconductor module further includes a high-potential conductor, a load conductor, a low-potential conductor, a first connecting conductor and a second connecting conductor. The high-potential conductor, which is to be coupled to a high-potential electrode of a power source, is integrated to the upper arm switching element. The load conductor, which is to be coupled to a load, is integrated to the lower arm switching element. The low-potential conductor is to be coupled to a low-potential electrode of the power source having a potential lower than a potential of the high-potential electrode. The first connecting conductor has a first end connected to the upper arm switching element and a second end connected to the load conductor. The second connecting conductor has a first end connected to the lower arm switching element and a second end connected to the low-potential conductor. At least one of the first connecting conductor and the second connecting conductor serves as a shunt resistor for detecting a magnitude of an electric current flowing between the first end and the second end of the at least one of the first connecting conductor and the second connecting conductor.

In the above semiconductor module, the number of components and the number of wiring portions reduce.

For example, to detect the electric current flowing between the lower arm switching element and the low-potential conductor, the second connecting conductor is used as the shunt resistor. In this case, the first end and the second end of the shunt resistor are coupled to sensor terminals through bonding wires for detecting the electric current.

According to another aspect of the present disclosure, a semiconductor module includes an upper arm switching element providing an upper arm part of a bridge circuit and a lower arm switching element providing a lower arm part of the bridge circuit. The upper arm part and the lower arm part are coupled to each other at an arm coupling point. The semiconductor module further includes a load relay switching element, a high-potential conductor, a first load relay preceding conductor, a first load relay subsequent conductor, a low-potential conductor, a first connecting conductor, a second connecting conductor and a third connecting conductor. The load relay switching element is disposed between the arm coupling point and a load. The load relay switching element provides a load relay that electrically couples and decouples between the arm coupling point and the load. The high-potential conductor, which is to be coupled to a high-potential electrode of a power source, is integrated to the upper arm switching element. The first load relay preceding conductor is integrated to the lower arm switching element. The first load relay subsequent conductor, which is to be coupled to the load, is integrated to the load relay switching element. The low-potential conductor is to be coupled to a low-potential electrode of the power source having a potential lower than that of the high-potential electrode. The first connecting conductor has a first end connected to the upper arm switching element and a second end connected to the first load relay preceding conductor. The second connecting conductor has a first end connected to the lower arm switching element and a second end connected to the low-potential conductor. The third connecting conductor has a first end connected to the load relay switching element and a second end connected to the first load relay preceding conductor. At least one of the first connecting conductor, the second connecting conductor, and the third connecting conductor serves as a shunt resistor for detecting a magnitude of an electric current flowing between the first end and the second end of the at least one of the first connecting conductor, the second connecting conductor and the third connecting conductor.

In the above semiconductor module, the number of components and the number of wiring portions reduce.

According to another aspect of the present disclosure, a semiconductor module includes an upper arm switching element providing an upper arm part of a bridge circuit and a lower arm switching element providing a lower arm part of the bridge circuit. The upper arm part and the lower arm part are coupled to each other at an arm coupling point. The semiconductor module further includes a load relay switching element, a high-potential conductor, a second load relay preceding conductor, a second load relay subsequent conductor, a low-potential conductor, a first connecting conductor, a second connecting conductor and a third connecting conductor. The load relay switching element is disposed between the arm coupling point and a load. The load relay switching element provides a load relay that electrically couples and decouples between the arm coupling point and the load. The high-potential conductor, which is to be coupled to a high-potential electrode of a power source, is integrated to the upper arm switching element. The second load relay preceding conductor is integrated to the lower arm switching element and the load relay switching element. The second load relay subsequent conductor is to be coupled to the load. The low-potential conductor is to be coupled to a low-potential electrode of the power source having a potential lower than that of the high-potential electrode. The first connecting conductor has a first end connected to the upper arm switching element and a second end connected to the second load relay preceding conductor. The second connecting conductor has a first end connected to the lower arm switching element and a second end connected to the low-potential conductor. The third connecting conductor has a first end connected to the load relay switching element and a second end connected to the second load relay subsequent conductor. At least one of the first connecting conductor, the second connecting conductor, and the third connecting conductor serves as a shunt resistor for detecting an electric current flowing between the first end and the second end of the at least one of the first connecting conductor, the second connecting conductor and the third connecting conductor.

In the above semiconductor module, the number of components and the number of wiring portions reduce.

BRIEF DESCRIPTION OF THE DRAWINGS

The above and other objects, features and advantages of the present disclosure will become more apparent from the following detailed description made with reference to the accompanying drawings, in which like parts are designated by like reference numbers and in which.

DETAILED DESCRIPTION

Exemplary embodiments of a semiconductor module according to the present disclosure will be hereinafter described with reference to the drawings. Like parts will be designated with like reference numbers throughout the exemplary embodiments. In the exemplary embodiments, the semiconductor module is employed in a motor driver, such as a driver for a three-phase brushless motor, for example.

First Embodiment

A semiconductor module according to a first embodiment will be described with reference to FIGS. 1 to 5.

Figure 2:
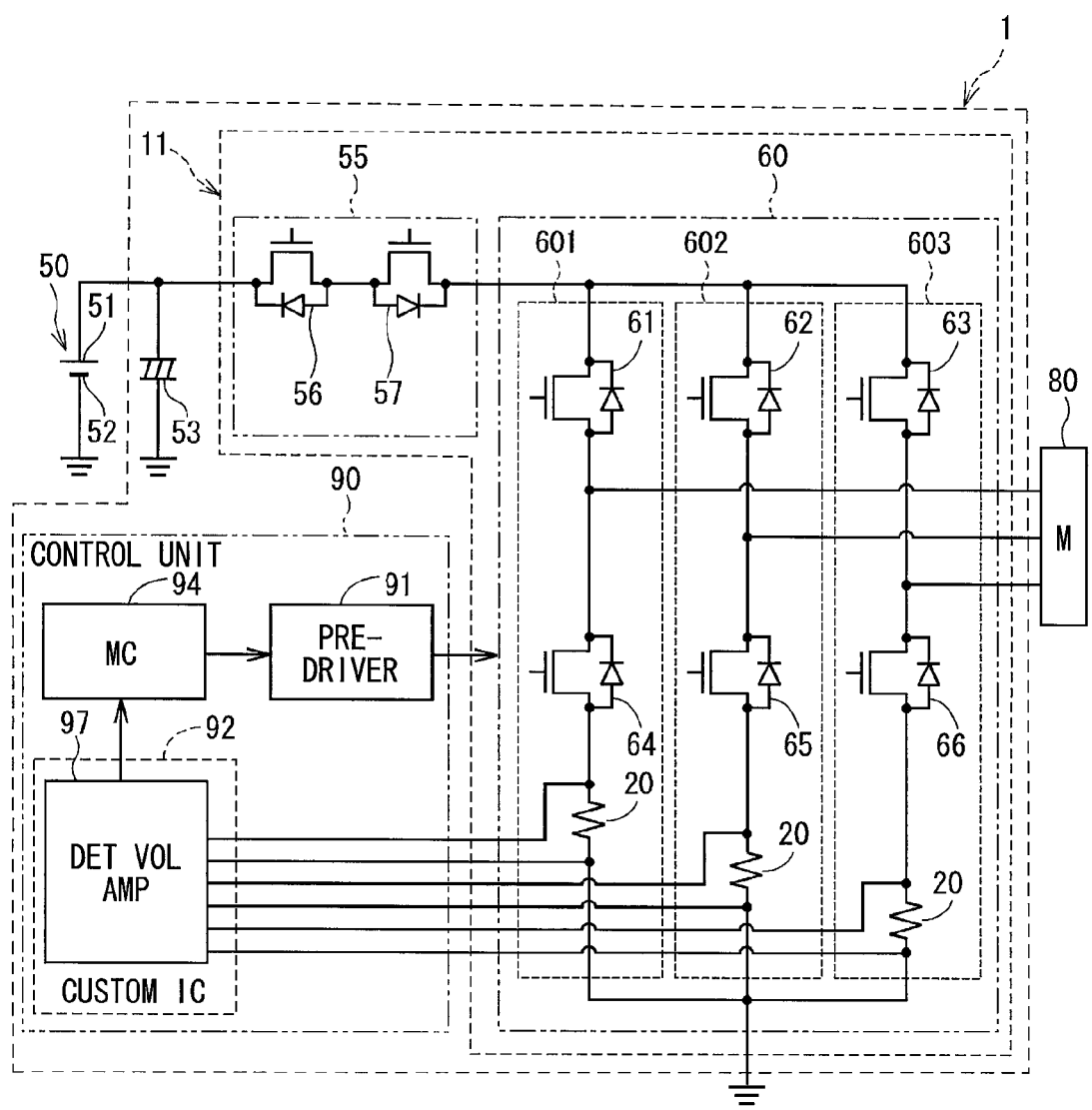
FIG. 2 is a schematic circuit diagram of a motor driver employing the semiconductor module, as a three-phase inverter circuit, according to the first embodiment.

Firstly, a structure of a motor driver 1 in which the semiconductor module of the first embodiment is employed will be described with reference to FIG. 2. The motor driver 1 converts DC power of a battery 50 as a power source into a three-phase AC power, and drives a motor 80 as a load. In the present embodiment, the motor 80 is a three-phase brushless motor, for example.

The motor driver 1 includes an electrolytic capacitor 53, a power source relay unit 55, an inverter unit 60, and a control unit 90.

The inverter unit 60 includes six switching elements 61 to 66, which are coupled in a bridge manner to constitute a bridge circuit. For example, the switching elements 61 to 66 are metal-oxide semiconductor field-effect transistors (MOSFET) having parasitic diodes. Hereinafter, the switching elements 61 to 66 will be also referred to as MOSs 61 to 66. In each of the MOSs 61 to 66, an electric current occurs between a source and a drain according to a gate potential. In other words, the MOS 61 to 66 is turned on and off according to a voltage applied to the gate.

In the inverter unit 60, the MOSs 61, 62, 63, which are at a high potential side, constitute an upper arm part of the bridge circuit, and the MOSs 64, 65, 66, which are at a low potential side, constitute a lower arm part of the bridge circuit.

The drain of each of the upper arm MOSs 61, 62, 63 is coupled to a high-potential line that is coupled to a high-potential electrode 51 of the battery 50. The source of each of the upper arm MOSs 61, 62, 63 is coupled to the drain of corresponding one of the lower arm MOSs 64, 65, 66. A coupling point between the source of the upper arm MOS 61, 62, 63 and the drain of the lower arm MOS 64, 65, 66 is coupled to a corresponding terminal of the motor 80, which forms a corresponding phase.

The source of each of the lower arm MOSs 64, 65, 66 is coupled to a ground line that is coupled to a low-potential electrode 52 of the battery 52. The potential of the upper arm MOSs 61, 62, 63 is higher than that of the lower arm MOSs 64, 65, 66. Thus, the upper arm MOSs 61, 62, 63 may be referred to as high potential-side MOSs, and the lower arm MOSs 64, 65, 66 may be referred to as low potential-side MOSs.

Further, a shunt resistor 20 is disposed between the source of each of the lower arm MOSs 64, 65, 66 and the ground line. Each of the shunt resistors 20 detects an electric current supplied to the corresponding phase of the motor 80.

The upper arm MOS 61, the lower arm MOS 64 and the shunt resistor 20 coupled to the lower arm MOS 64 constitute a U-phase circuit 601. The upper arm MOS 62, the lower arm MOS 65 and the shunt resistor 20 coupled to the lower arm MOS 65 constitute a V-phase circuit 602. The upper arm MOS 63, the lower arm MOS 66 and the shunt resistor 20 coupled to the lower arm MOS 66 constitute a W-phase circuit 603.

The electrolytic capacitor 53 and the power source relay unit 55 are disposed between the high-potential electrode 51 of the battery 50 and the inverter unit 60. The electrolytic capacitor 53 charges electricity and smoothes energy from the battery 50.

The power source relay unit 55 includes two switching elements 56, 57 connected in series to each other. The power source relay unit 55 electrically couples and decouples between the battery 50 and the inverter unit 60. Each of the switching elements 56, 57 is provided by a MOSFET having a parasitic diode, similar to the switching elements 61 to 66 of the bridge circuit. Hereinafter, the switching elements 56, 57 will be also referred to as a power source relay MOSs 56, 57.

The power source relay MOS 56 and the power source relay MOS 57 are coupled to each other such that the directions of the parasitic diodes are reverse to each other. In such a case, even if the battery 50 is connected in a reversed direction, it is less likely that an electric current will flow through the parasitic diodes when the power source relay MOSs 56, 57 are both turned off.

The control unit 90 includes a predriver 91, a custom IC 92 and a microcomputer 94. The custom IC 92 includes a detection voltage amplifying part 97 and the like as a function block. The detection voltage amplifying part 97 detects voltages at both ends of each of the shunt resistors 20, and amplifies the voltages. Further, the detection voltage amplifying part 97 outputs the voltages amplified to the microcomputer 94.

The microcomputer 94 detects the electric current supplied to the motor 80 based on the voltages of both the ends of the shunt resistors 20, which are outputted from the detection voltage amplifying part 97. The microcomputer 94 receives signals, such as a signal indicative of an angle of rotation of the motor 80. The microcomputer 94 drives the predriver 91 based on the signals received, thereby to control the inverter unit 60.

In particular, an output terminal of the predriver 91 is connected to the gate of each of the MOSs 61 to 66. The predriver 91 changes a gate voltage applied to the gate of the MOS 61 to 66 to switch on and off of the MOS 61 to 66.

In the present embodiment, among the components of the motor driver 1 described above, the power source relay MOSs 56, 57 of the power source relay unit 55 and the MOSs 61 to 66 of the inverter unit 60 are integrated into one semiconductor module 11. A structure of the semiconductor module 11 will be described with reference to FIGS. 3 and 4.

Figure 3:
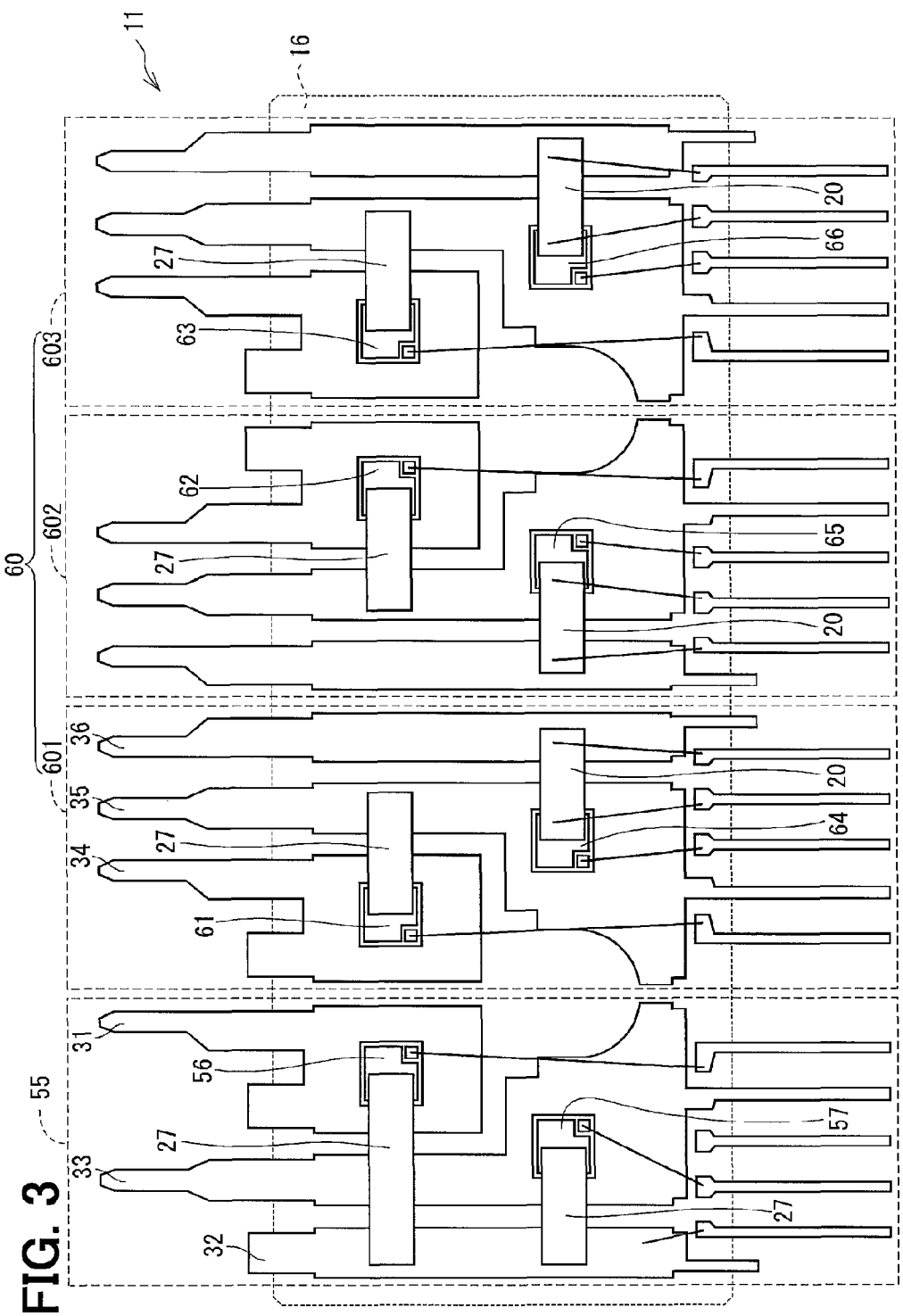
FIG. 3 is a schematic plan view of the semiconductor module having the shunt resistor according to the first embodiment.

As shown in FIG. 3, the semiconductor module 11 generally includes the power source relay unit 55, the U-phase circuit 601, the V-phase circuit 602, and the W-phase circuit 603, as four blocks. These four blocks are integrated with a mold part 16 into a generally plate shape.

In the semiconductor module 11, power terminals project from one of lengthwise sides of the mold part 16 having the plate shape, such as from an upper side of the mold part 16 in FIG. 3, and signal terminals project from the other of the lengthwise sides of the mold part 16, such as from a lower side of the mold part 16 in FIG. 3. The width of the power terminals is generally greater than the width of the signal terminals.

The power source relay unit 55 includes the power source relay MOSs 56, 57, a preceding lead frame 31, a middle lead frame 32, a subsequent lead frame 33, and two copper clips 27.

The preceding lead frame 31 has a terminal that is coupled to the high-potential electrode 51 of the battery 50 through a power substrate (not shown). The power source relay MOS 56 is mounted on the preceding lead frame 31.

The subsequent lead frame 33 has a terminal that is coupled to a terminal of a high-potential lead frame of each of the U-phase circuit 601, the V-phase circuit 602 and the W-phase circuit 603, through a power substrate (not shown). The power source relay MOS 57 is mounted on the subsequent lead frame 33.

One of the two copper clips 27 connects between the power source relay MOS 56 and the middle lead frame 32, and the other of the two copper clips 27 connects between the middle lead frame 32 and the power source relay MOS 57.

In the structure described above, the power source relay MOS 56 and the power source relay MOS 57 are coupled in series, between the battery 50 and the inverter unit 60.

The U-phase circuit 601, the V-phase circuit 602 and the W-phase circuit 603 have substantially the same structure. Therefore, the structure of the U-phase circuit 601, the V-phase circuit 602 and the W-phase circuit 603 will be hereinafter described in regard to the U-phase circuit 601 as a representative.

The U-phase circuit 601 includes the upper arm MOS 61, the lower arm MOS 64, a high-potential lead frame 34, a motor lead frame 35, a low-potential lead frame 36, a copper clip 27, and the shunt resistor 20. The high-potential lead frame 34 corresponds to a high-potential conductor. The motor lead frame 35 corresponds to a load conductor. The low-potential lead frame 36 corresponds to a low-potential conductor. Also, in the present embodiment, the copper clip 27 corresponds to a first connecting conductor, and the shunt resistor 20 corresponds to a second connecting conductor that serves also as a shunt resistor.

The high-potential lead frame 34 has a terminal connected to the subsequent lead frame 33 of the power source relay unit 55. Namely, the terminal of the high-potential lead frame 34 is coupled to the high-potential electrode 51 of the battery 50 through the power source relay 55. The high-potential lead frame 34 is integrated to the upper arm MOS 61. For example, the upper arm MOS 61 is mounted on the high-potential lead frame 34 such that the drain provided on a rear surface of the upper arm MOS 61 is in contact with an upper surface of the high-potential lead frame 34.

The motor lead frame 35 has a terminal coupled to an input terminal of the motor 80. The motor lead frame 35 is integrated to the lower arm MOS 64. For example, the lower arm MOS 64 is mounted on the motor lead frame 35 such that the drain provided on a rear surface of the lower arm MOS 64 is in contact with an upper surface of the motor lead frame 35.

The low-potential lead frame 36 has a terminal coupled to the low-potential electrode 52 of the battery 50.

The copper clip 27 has a first end connected to the source of the upper arm MOS 61 and a second end connected to the motor lead frame 35. The source of the upper arm MOS 61 is provided on an upper surface of the upper arm MOS 61. As such, the source of the upper arm MOS 61 and the drain of the lower arm MOS 64 are coupled to each other.

Figure 4:
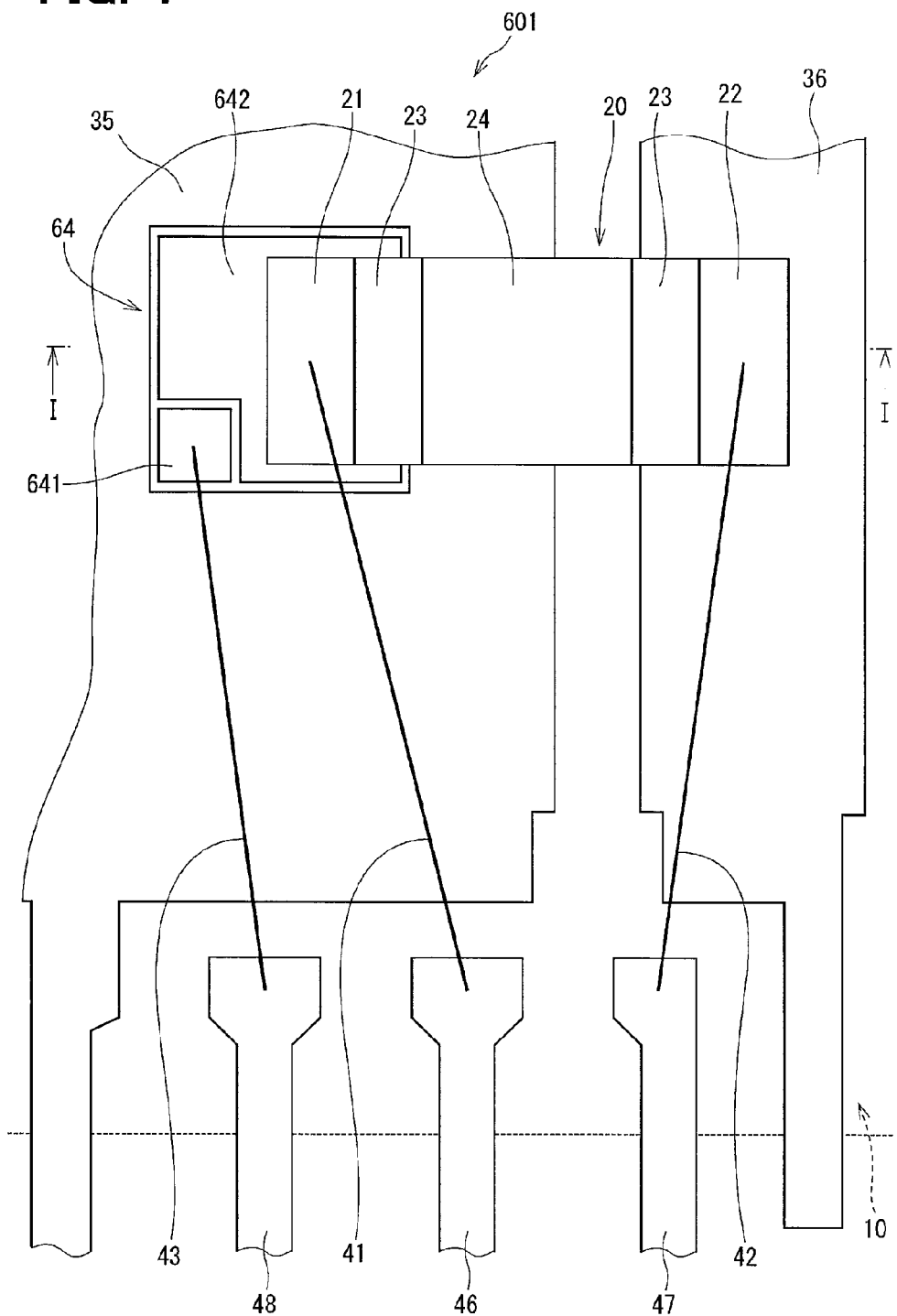
FIG. 4 is an enlarged view of a part of the semiconductor module shown in FIG. 3.

As shown in FIGS. 3 and 4, the shunt resistor 20 has a first end connected to a source 642 of the lower arm MOS 64 and a second end connected to the low-potential lead frame 36. The first end of the shunt resistor 20 is coupled to a sensor terminal 46 through a bonding wire 41. The second end of the shunt resistor 20 is coupled to a sensor terminal 47 through a bonding wire 42. The sensor terminals 46, 47 are coupled to the detection voltage amplifying part 97.

A gate 641 of the lower arm MOS 64 is coupled to an output terminal 48 of the predriver 91 through a bonding wire 43, so that on and off states of the lower arm MOS 64 are controlled by the predriver 91.

The copper clip 27 is made of substantially pure copper. On the other hand, the shunt resistor 20 is made of a material, such as manganin (copper-manganese-nickel alloy), copper-nickel alloy, and nickel-chrome alloy.

Although the copper has a relatively low electric resistance, the electric resistance of the copper has relatively high temperature-dependence. On the other hand, the electric resistance of the manganin, the copper nickel alloy, and the nickel-chrome alloy has relatively low temperature dependence. According to a literature, the resistivity of copper at 20 degrees Celsius (° C.) is $1.7 \times 10^{-8}$ Ω·m, and the temperature coefficient of copper is $4.3 \times 10^{-3}$/° C. On the other hand, the resistivity of manganin at a room temperature is $34 \times 10^{-8}$ Ω·m to $100 \times 10^{-8}$ Ω·m, and the temperature coefficient of manganin is $-0.03 \times 10^{3}$/° C. to $0.02 \times 10^{-3}$/° C.

Since the shunt resistor 20 is made of the material having the small temperature coefficient, an effect due to a change in temperature, such as heat generation, is reduced. As such, accuracy of detecting the electric current improves.

Figure 1:
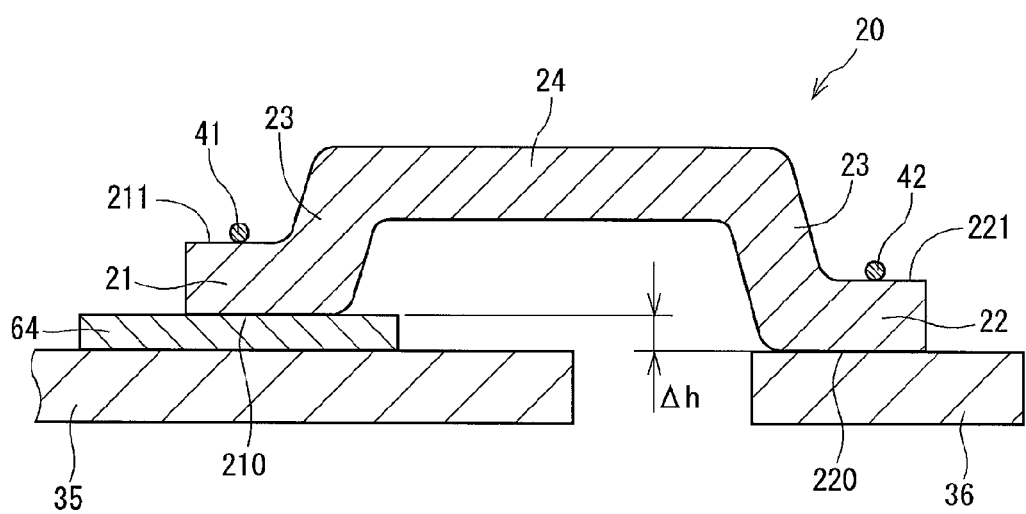
FIG. 1 is a cross-sectional view of a shunt resistor of a semiconductor module according to a first embodiment of the present disclosure.

Next, a structure of the shunt resistor 20 will be described with reference to FIGS. 1, 4 and 5. FIG. 1 is a cross-sectional view of the shunt resistor 20 taken along a line I-I in FIG. 4. As shown in FIGS. 1 and 4, the shunt resistor 20 is formed by bending a rectangular metal plate into a predetermined shape. The metal plate is, for example, a manganin plate, a copper-nickel plate, a nickel-chrome plate or the like.

The metal plate is bent at longitudinal ends by pressing or the like. Thus, the shunt resistor 20 has a first leg portion 21 at the first end and a second leg portion 22 at the second end. Also, the shunt resistor 20 has a body portion 24 at a middle portion between the first leg portion 21 and the second leg portion 22. A bottom surface (end surface) 210 of the first leg portion 21 is in contact with the lower arm MOS 64 disposed on the motor lead frame 35. A bottom surface (end surface) 220 of the second leg portion 22 is in contact with the low-potential lead frame 36.

The body portion 24 is located higher than the first leg portion 21 and the second leg portion 22. In other words, the body portion 24 is further from the motor lead frame 35 and the low-potential lead frame 36 than the first leg portion 21 and the second leg portion 22 with respect to a direction perpendicular to a surface of the motor lead frame 35.

The bottom surface 210 of the first leg portion 21 is located higher than the bottom surface 220 of the second leg portion 22 by a dimension Δh, which corresponds to the height (thickness) of the lower arm MOS 64. Namely, the bottom surface 210 of the first leg portion 21 is offset from the bottom surface 220 of the second leg portion 22 by the thickness of the lower arm MOS 64 with respect to the direction perpendicular to the surface of the motor lead frame 35.

The bonding wire 41 is connected to an upper surface 211 of the first leg portion 21. The bonding wire 42 is connected to an upper surface 221 of the second leg portion 22.

The first leg portion 21 connects to the body portion 24 through an inclined portion 23. Similarly, the second leg portion 22 connects to the body portion 24 through an inclined portion 23.

Figure 5:
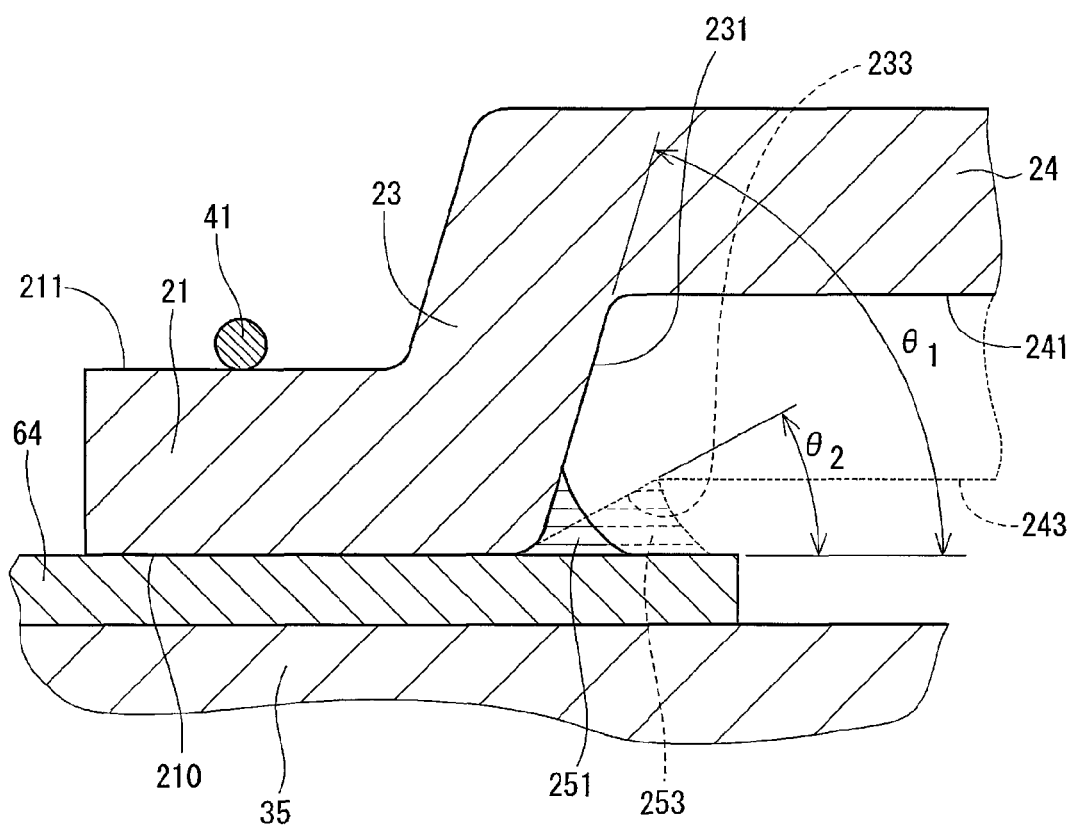
FIG. 5 is an enlarged cross-sectional view of a part of the shunt resistor shown in FIG. 1.

FIG. 5 illustrates an example of the inclined portion 23 between the first leg portion 21 and the body portion 24. As shown in FIG. 5, an inclination angle θ1 of an inner surface 231 of the inclined portion 23 relative to the upper surface of the lower arm MOS 64 is relatively large, and may be approximate to a right angle. In the example of FIG. 5, the inclination angle θ1 is approximately 75 degrees.

This structure restricts a solder 251 disposed at the lower portion of the inclined portion 23 from rising, when the shunt resistor 20 is soldered to the lower arm MOS 64. That is, the solder 251 can be maintained at the lower position of the inner surface 231 of the inclined portion 23, and will not reach a lower surface 241 of the body portion 24.

In FIG. 5, a dashed line 233 indicates an inner surface of the inclined portion 23, which defines an inclination angle θ2 smaller than the inclination angle θ1. If the inclination angle of the inner surface of the inclined portion 23 is small as the inclination angle θ2, a solder 253 easily rises along the inner surface 233. As a result, the solder 253 will reach a lower surface 243 of the body portion 24 or reach a position adjacent to the lower surface 243. In such a case, an electric current path from the body portion 34 to the lower arm MOS 64 will short-circuit through the solder 253, and hence a resistive characteristic of the shunt resistor 20 will vary. Further, accuracy of detecting the electric current will reduce.

When the inclination angle of the inner surface 231 of the inclined portion 23 is set at a relatively large angle as the inclination angle θ1, the solder 251 is restricted from rising along the inner surface 231. As a result, the accuracy of detecting the electric current through the shunt resistor 20 improves.

The inclined portion 23 between the second leg portion 22 and the body portion 24 may have the similar structure to the inclined portion 23 between the first leg portion 21 and the body portion 24.

Next, advantageous effects of the semiconductor module 11 will be described while comparing to a comparative example shown in FIG. 6.

Figure 6:
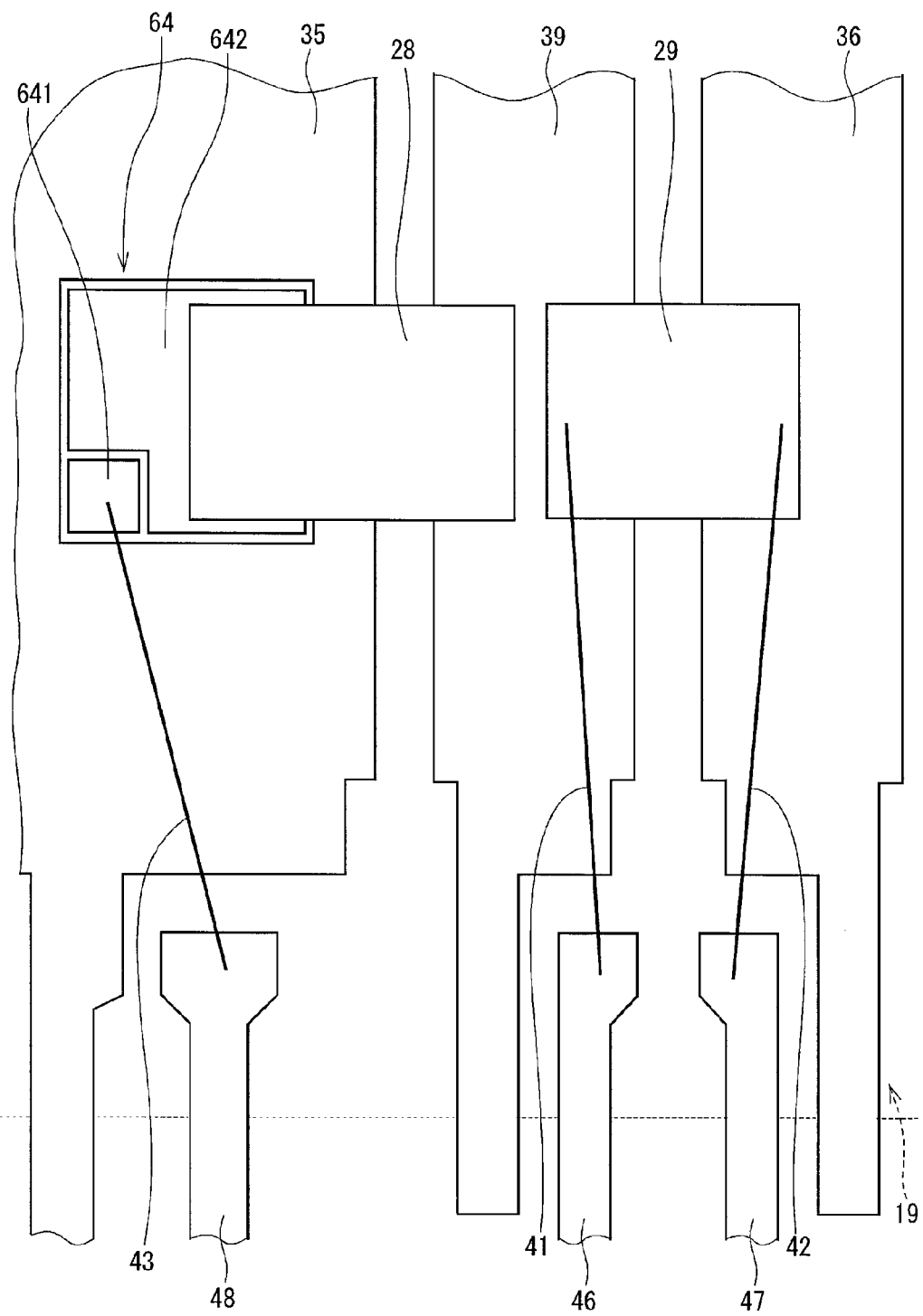
FIG. 6 is an enlarged view of a part of a semiconductor module as a comparative example to the first embodiment.

As shown in FIG. 6, a semiconductor module 19 of the comparative example additionally has an intermediate lead frame 39 between the motor lead frame 35 and the low-potential lead frame 36. The lower arm MOS 64, which is mounted on the motor lead frame 35, is connected to the intermediate lead frame 39 through a copper clip 28. The intermediate lead frame 39 is connected to the low-potential lead frame 36 through a shunt resistor 29.

In this case, the shunt resistor 29 has a first end connected to the intermediate lead frame 39 and a second end connected to the low-potential lead frame 36. Further, the first end of the shunt resistor 29 is connected to the sensor terminal 46 through the bonding wire 41, and the second end of the shunt resistor 29 is connected to the sensor terminal 47 through the bonding wire 42. In the comparative example shown in FIG. 6, parts similar to the first embodiment will be designated with the like reference numbers.

In the semiconductor module 19 of the comparative example, the copper clip 28 as the second connecting conductor for forming the driving current path and the shunt resistor 29 as a member for detecting the electric current are separate members. Therefore, the number of components and the number of wiring portions (connecting portions) increase.

In the semiconductor module 11 of the first embodiment, on the other hand, the shunt resistor 20 serves as the second connecting conductor as well as the element for detecting the electric current. Therefore, the number of components and the number of wiring portions reduce.

In the shunt resistor 20 of the first embodiment, the bottom surface 210 of the first leg portion 21 is located higher than the bottom surface 220 of the second leg portion 22 by the dimension Δh, which corresponds to the height (thickness) of the MOS 64 with respect to the direction perpendicular to the surface of the motor lead frame 35. Therefore, when the lead frames 35, 36 are arranged such that the upper surface of the lead frame 35 and the upper surface of the lead frame 36 are at the same height, the body portion 24 is disposed parallel to the lead frames 35, 36. As such, an ordinary layout is achieved.

In regard to the shunt resistor of JP2001-118701A, connecting positions of bonding wires are limited on a pair of electrode pads disposed at predetermined portions of the shunt resistor. In the shunt resistor 20 of the first embodiment, on the other hand, the bonding wires 41, 42 may be connected to any positions in the upper surfaces 211, 221 of the first and second leg portions 21, 22. Therefore, flexibility of wirings improves.

Second Embodiment

A second embodiment of the present disclosure will be described with reference to FIG. 7.

Figure 7:
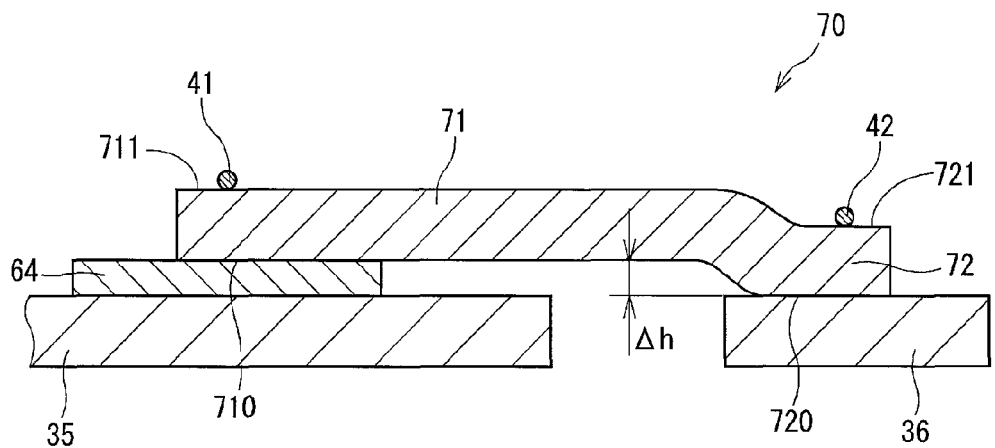
FIG. 7 is a cross-sectional view of a shunt resistor of a semiconductor module according to a second embodiment of the present disclosure.

As shown in FIG. 7, the semiconductor module 11 of the present embodiment has a shunt resistor 70, in place of the shunt resistor 20. The shunt resistor 70 includes a first leg portion 71 and a second leg portion 721. The first leg portion 71 serves as a leg portion connecting to the lower arm MOS 64 as well as a body portion of the shunt resistor 70. In other words, a bottom surface 710 of the first leg portion 71 connecting to the lower arm MOS 64 is coplanar with a bottom surface of the body portion, and there is no boundary between the first leg portion 71 and the body portion.

The second leg portion 72 connecting to the low-potential lead frame 36 has a shape similar to the second leg portion 22 of the first embodiment. The bottom surface 710 of the first leg portion 71 is located higher than a bottom surface 720 of the second leg portion 72 by the dimension Δh corresponding to the height (thickness) of the MOS 64 with respect to the direction perpendicular to the surface of the motor lead frame 35. The bonding wire 41 is connected to an upper surface 711 of the first leg portion 71, and the bonding wire 42 is connected to an upper surface 721 of the second leg portion 72.

Accordingly, the advantageous effects similar to the first embodiment will be achieved also by the shunt resistor 70 of the second embodiment.

Third Embodiment

A third embodiment of the present disclosure will be described with reference to FIG. 8.

Figure 8:
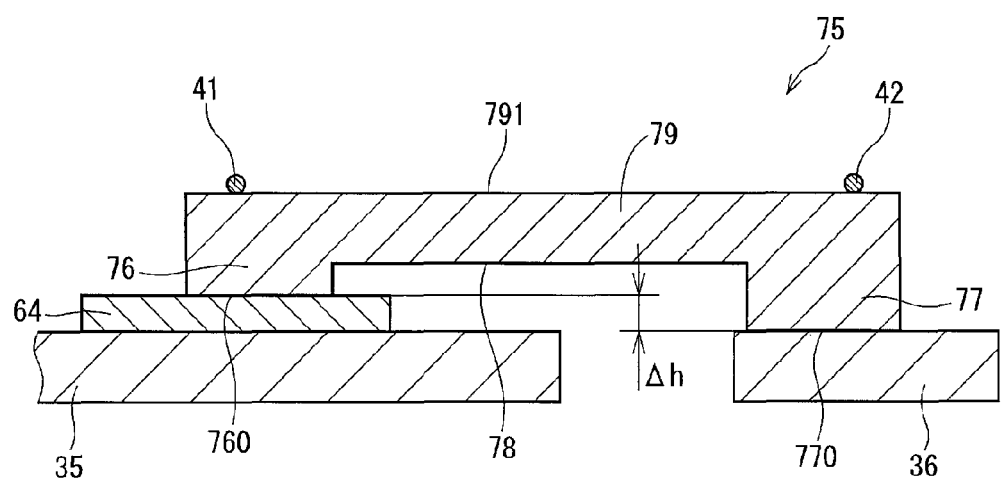
FIG. 8 is a cross-sectional view of a shunt resistor of a semiconductor module according to a third embodiment of the present disclosure.

As shown in FIG. 8, the semiconductor module 11 of the present embodiment has a shunt resistor 75, in place of the shunt resistor 20 of the first embodiment. The shunt resistor 75 is made of a metal plate, and a depressed portion (groove) 78 is formed at a middle portion of the metal plate with respect to a longitudinal direction. For example, the depressed portion 78 is made by a cutting process, a laser working or the like.

The shunt resistor 75 has a body portion 79 at the middle portion, which corresponds to the depressed portion 78, but remained without being cut.

Further, the shunt resistor 75 has a first leg portion 76 and a second leg portion 77 at remaining portions defined at longitudinal ends of the body portion 79. Also, a bottom surface of the first leg portion 76 is located higher than a bottom surface 770 of the second leg portion 77 by a dimension Δh corresponding to the height (thickness) of the MOS 64.

The bonding wire 41 is connected to a first end of an upper surface 791 of the body portion 79, the first end being adjacent to the first leg portion 76. The bonding wire 42 is connected to a second end of the upper surface 791 of the body portion 79, the second end being adjacent to the second leg portion 77.

Accordingly, the advantageous effects similar to the first embodiment will be achieved also by the shunt resistor 75 of the third embodiment.

Fourth Embodiment

Next, a fourth embodiment will be described with reference to FIGS. 9 and 10.

Figure 9:
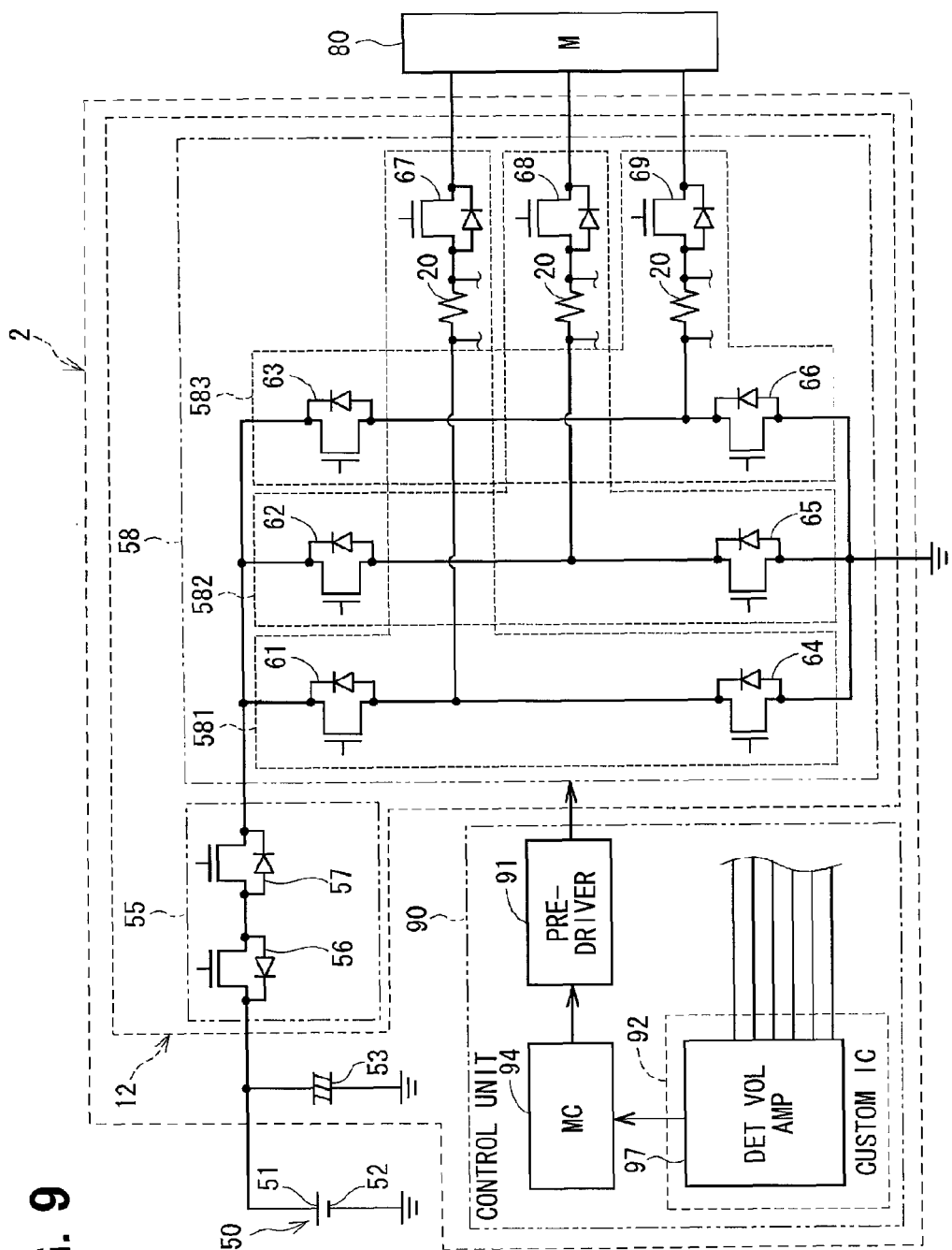
FIG. 9 is a schematic circuit diagram of a motor driver employing a semiconductor module, as a three-phase inverter circuit, according to a fourth embodiment of the present disclosure.

As shown in FIG. 9, a semiconductor module 12 according to the fourth embodiment is employed in a motor driver 2. The semiconductor module 12 includes an inverter unit 58, in place of the inverter unit 60 of the first embodiment. The inverter unit 58 includes switching elements 67, 68, 69, as load relays, for respective phase circuits 581, 582, 583, in addition to the MOSs 61 to 66.

The switching elements 67, 68, 69 are provided by a MOS-FET, similar to the switching element of the bridge circuit. Each of the switching elements 67, 68, 69 electrically couples and decouples between an arm coupling point, which is a coupling point between the upper arm part and the lower arm part of the corresponding phase circuit, and the motor 80. Hereinafter, the switching elements 67, 68, 69 will be also referred to as motor relay MOSs 67, 68, 69.

In the fourth embodiment, each of the motor relay MOSs 67, 68, 69 has the source adjacent to the bridge circuit and the drain adjacent to the motor 80. The shunt resistor 20 is disposed between the arm coupling point of the corresponding phase circuit and the corresponding motor relay MOS 67, 68, 69.

In the inverter unit 58, the upper arm MOS 61, the lower arm MOS 64, the shunt resistor 20 and the motor relay MOS 67 constitute a U-phase circuit 581. The upper arm MOS 62, the lower arm MOS 65, the shunt resistor 20 and the motor relay MOS 67 constitute a V-phase circuit 582. The upper arm MOS 63, the lower arm MOS 66, the shunt resistor 20 and the motor relay MOS 67 constitute a W-phase circuit 583.

The U-phase circuit 581, the V-phase circuit 582, and the W-phase circuit 583 have substantially the same structure. Therefore, a structure of the semiconductor module 12, which physically form the respective circuits 581, 582, 583, will be described in regard to the U-phase circuit 581 as a representative.

Figure 10:
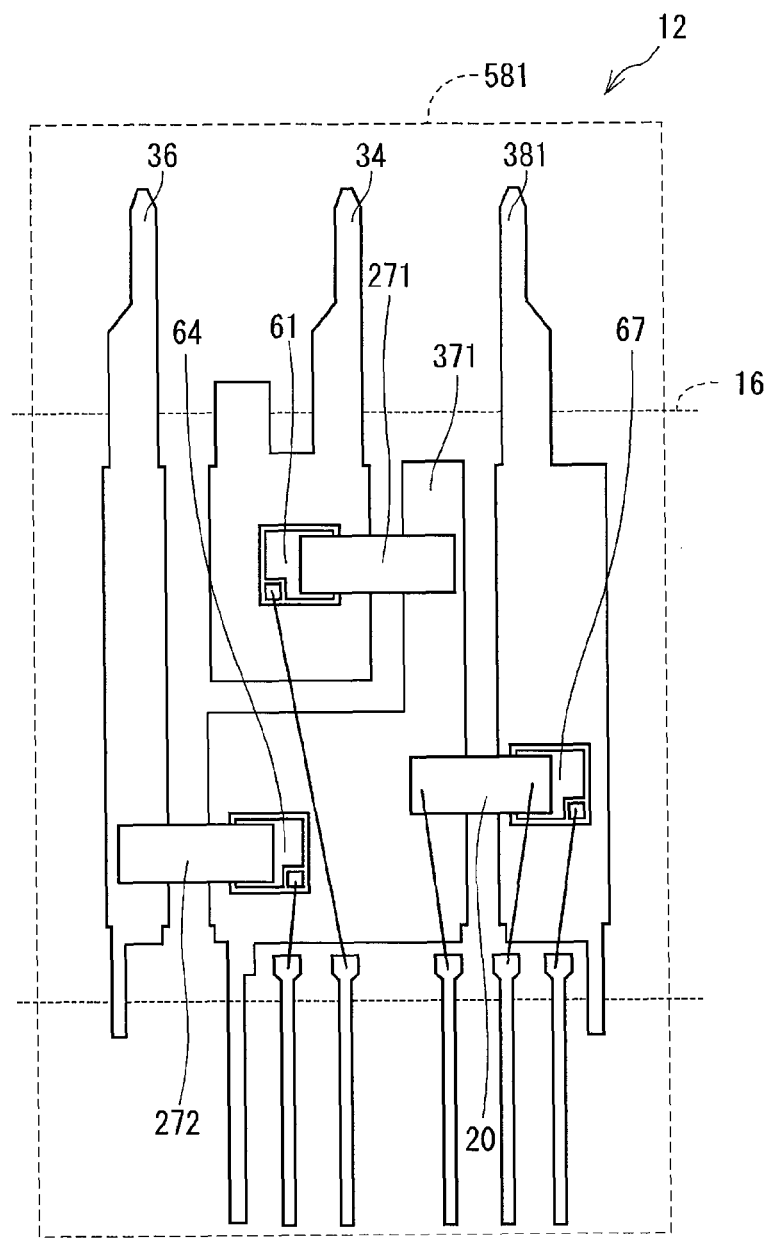
FIG. 10 is a schematic plan view of a part of the semiconductor module according to the fourth embodiment.

As shown in FIG. 10, the U-phase circuit 581 includes the upper arm MOS 61, the lower arm MOS 64, the motor relay MOS 67, the high-potential lead frame 34, a motor relay preceding lead frame 371, a motor relay subsequent lead frame 381, the low-potential lead frame 36, copper clips 271, 272, the shunt resistor 20.

The motor relay preceding lead frame 371 corresponds to a first load relay preceding conductor, and the motor relay subsequent lead frame 381 corresponds to a first load relay subsequent conductor. Further, the copper clip 271 corresponds to the first connecting conductor, and the copper clip 272 corresponds to the second connecting conductor. The shunt resistor 20 corresponds to a third connecting conductor serving as a shunt resistor. Moreover, the motor relay MOS 67 corresponds to a load relay switching element that provides the load relay.

In regard to the high-potential lead frame 34 and the low-potential lead frame 36, a description of the similar features to those of the semiconductor module 11 of the first embodiment will not be repeated.

The lower arm MOS 64 is integrated to the motor relay preceding lead frame 371. For example, the lower arm MOS 64 is mounted on the motor relay preceding lead frame 371. The terminal of the motor relay subsequent lead frame 381 is connected to the input terminal of the motor 80.

The motor relay MOS 67 is integrated to the motor relay subsequent lead frame 381. For example, the motor relay MOS 67 is mounted on the motor relay subsequent lead frame 381 such that the drain of the motor relay MOS 67 provided on the rear surface of the motor relay MOS 67 is in contact with the upper surface of the motor relay subsequent lead frame 381.

The copper clip 271, as the first connecting conductor, has a first end connected to the source of the upper arm MOS 61 disposed at the upper surface of the upper arm MOS 61, and a second end connected to the motor relay preceding lead frame 371. The copper clip 272, as the second connecting conductor, has a first end connected to the source of the lower arm MOS 64 provided at the upper surface of the lower arm MOS 64, and a second end connected to the low-potential lead frame 36.

The shunt resistor 20 serving as the third connecting conductor has a first end connected to the source of the motor relay MOS 67 and a second end connected to the motor relay preceding lead frame 371.

In the present embodiment, the shunt resistor 20 detects the electric current flowing to the motor 80. Also in the semiconductor module 12 of the present embodiment, the shunt resistor 20 serves as the third connecting conductor as well as the shunt resistor, the number of components and the number of wiring portions will reduce, similar to the semiconductor module 11 of the first embodiment.

Fifth Embodiment

A fifth embodiment will be described with reference to FIGS. 11 and 12.

Figure 11:
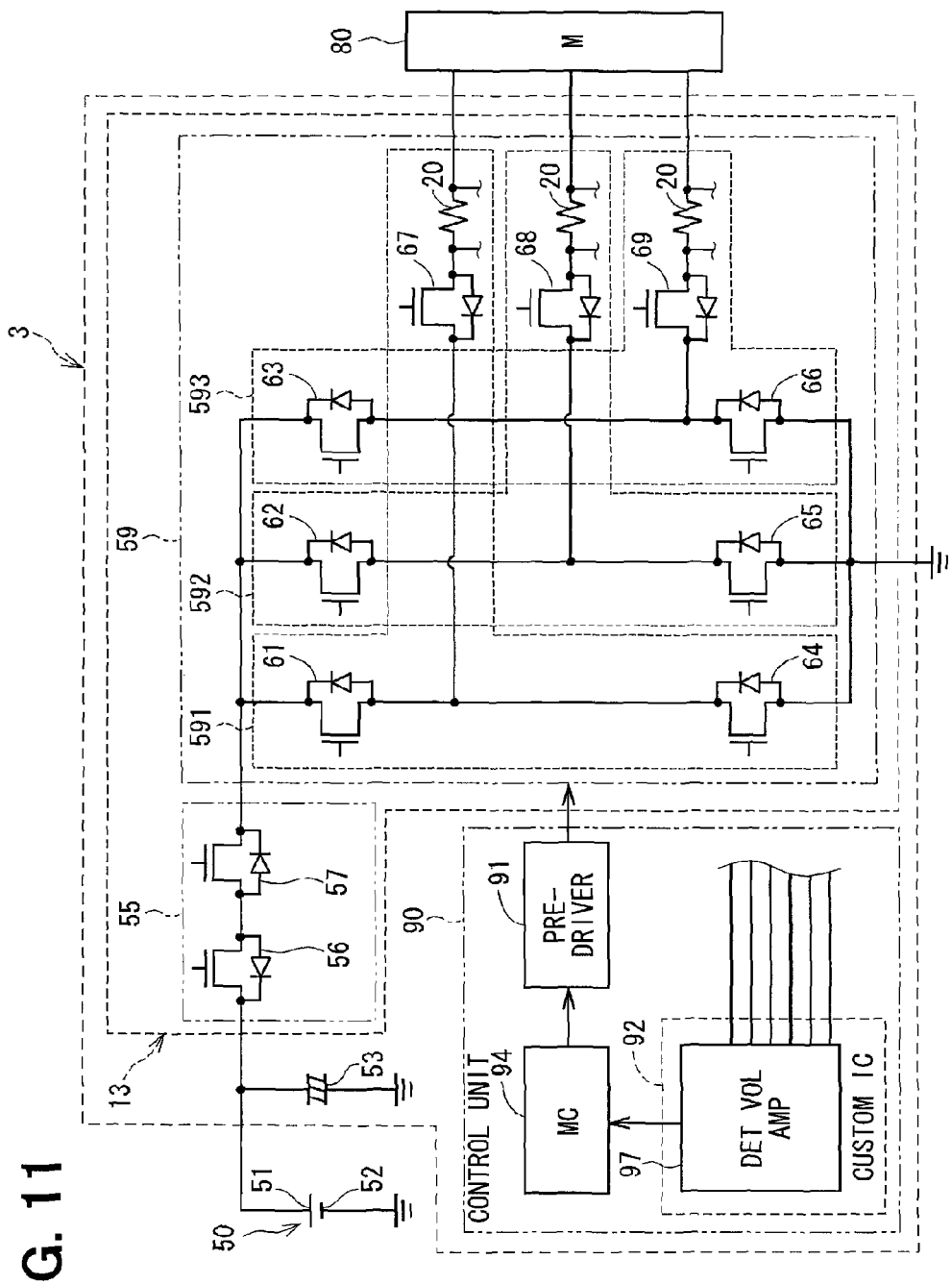
FIG. 11 is a schematic circuit diagram of a motor driver employing a semiconductor module, as a three-phase inverter circuit, according to a fifth embodiment of the present disclosure.

As shown in FIG. 11, a semiconductor module 13 according to the fifth embodiment will be employed in a motor driver 3. In the semiconductor module 13, arrangement of the motor relay MOSs 67, 68, 69 and the shunt resistors 20 of the inverter unit 59 and the direction of the parasitic diodes of the motor relay MOSs 67, 68, 69 are different from those of the semiconductor module 12 of the fourth embodiment.

In the fifth embodiment, the motor relay MOSs 67, 68, 69 have the drain adjacent to the bridge circuit, and the source adjacent to the motor 80. The shunt resistors 20 are disposed between the motor relay MOSs 67, 68, 69 and the motor 80.

In the inverter unit 59, the upper arm MOS 61, the lower arm MOS 64, the motor relay MOS 67 and the shunt resistor 20 constitute a U-phase circuit 591. The upper arm MOS 62, the lower arm MOS 65, the motor relay MOS 67 and the shunt resistor 20 constitute a V-phase circuit 592. Also, the upper arm MOS 63, the lower arm MOS 66, the motor relay MOS 67 and the shunt resistor 20 constitute a W-phase circuit 593.

A difference between the semiconductor module 13 of the fifth embodiment and the semiconductor module 12 of the fourth embodiment will be described in regard to the U-phase circuit 591 as a representative.

Figure 12:
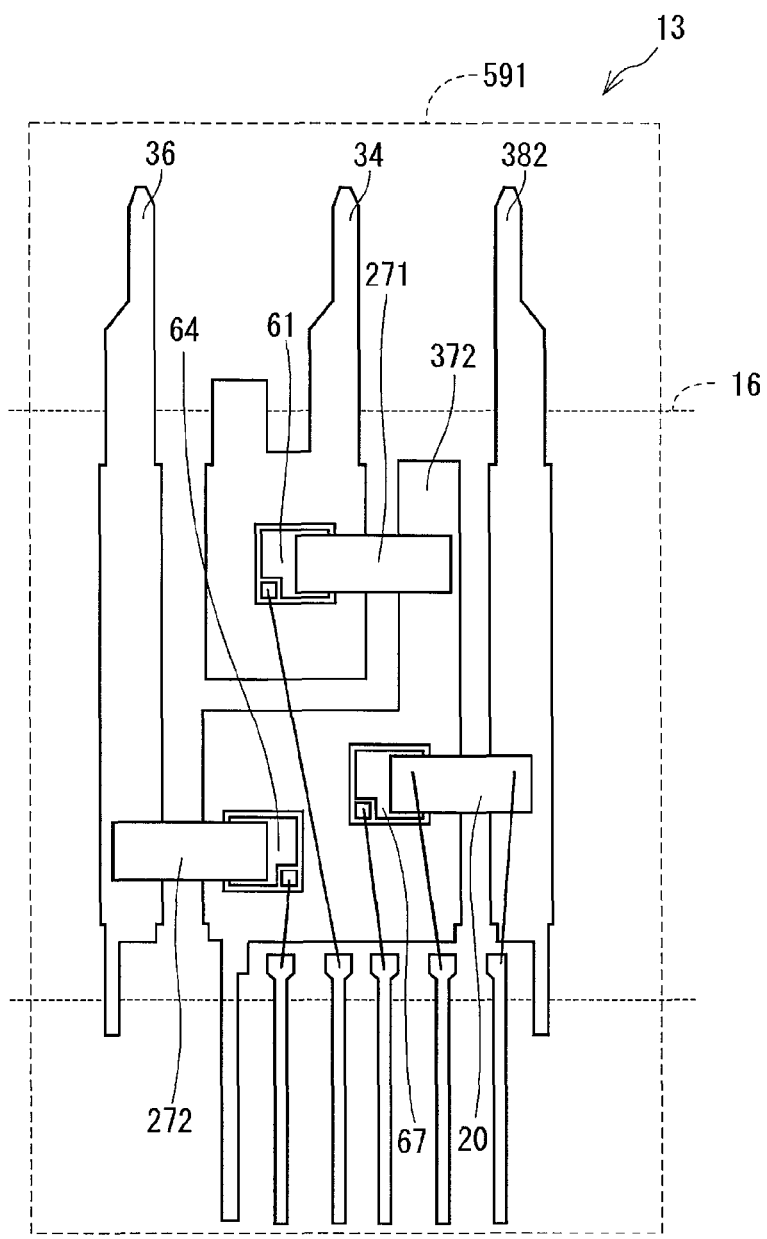
FIG. 12 is a schematic plan view of a part of the semiconductor module according to the fifth embodiment.

As shown in FIG. 12, in the U-phase circuit 591, a structure associated with the motor relay preceding lead frame 372 and the motor relay subsequent lead frame 382 is partly different from that of the fourth embodiment. The motor preceding lead frame 372 corresponds to a second load relay preceding conductor, and the motor relay subsequent lead frame 382 corresponds to a second load relay subsequent conductor.

The motor relay preceding lead frame 372 is integrated to the lower arm MOS 64 and the motor relay MOS 67. For example, the lower arm MOS 64 and the motor relay MOS 67 are mounted on the motor relay preceding lead frame 372. On the other hand, the motor relay subsequent lead frame 382 is not integrated to a MOS. The shunt resistor 20, which serves as the third connecting conductor, has a first end connected to the source of the motor relay MOS 67 and a second end connected to the motor relay subsequent lead frame 382.

In the present embodiment, the shunt resistor 20 detects the electric current flowing to the motor 80. Also in the semiconductor module 13 of the present embodiment, the shunt resistor 20 serves as the third connecting conductor as well as the shunt resistor, the number of components and the number of wiring portions will reduce, similar to the semiconductor module 11 of the first embodiment.

Other Embodiments (1) The arrangement and layout of the respective phase circuits of the inverter units 58, 59, 60, and the arrangement and layout of the power source relay unit 55 are not limited to the examples discussed in the above described embodiments. Also, the shape and layout of the lead frames are not limited to the examples discussed in the above described embodiments. Further, it is not always necessary that the semiconductor modules 11, 12, 13 have the power source relay unit 55.

(2) The bridge circuit of the semiconductor modules 11, 12, 13 is not limited to the three-phase inverter circuit. For example, the bridge circuit of the semiconductor modules 11, 12, 13 may be a half-bridge circuit including four switching elements. For example, the half-bridge circuit may be employed to a diver for a brush motor. Further, the three-phase inverter circuit and the half-bridge circuit may be employed to any device other than the motor driver.

(3) The shape of the shunt resistors 20, 70, 75 may be modified. For example, the shunt resistor may be configured such that the bottom surface 210, 710, 760 of the first leg portion 21, 71, 76 and the bottom surface 220, 720, 770 of the second leg portion 22, 72, 77 are at the same height, that is, are included in the same plane. In such a case, the height of the motor lead frame 35 on which the lower arm MOS 64 is mounted and the height of the low-potential lead frame 36 may be offset from each other such as by depressing.

For example, in the first to third embodiments, the upper surface of the lower arm MOS 64 mounted on the motor lead frame 35 and the upper surface of the low-potential lead frame 36 may be at the same height. In this case, the shunt resistor in which the bottom surface of the first leg portion and the bottom surface of the second leg portion are at the same height may be used. Also, the shunt resistor having a single planar bottom surface may be used.

As another example, the lower arm MOS 64 may be embedded in the motor lead frame 35 such that the upper surface of the lower arm MOS 64 is coplanar with the upper surface of the motor lead frame 35. In this case, the motor lead frame 35 to which the first leg portion 21, 71, 76 is integrated and the low-potential lead frame 36 to which the second leg portion 22, 72, 77 is integrated are at the same height. In this case, the shunt resistor in which the bottom surface of the first leg portion and the bottom surface of the second leg portion are at the same height may be used. Also, the shunt resistor having a single plane bottom surface may be used.

(4) In the first to third embodiment, the second connecting conductor that connects the lower arm MOS 64 and the low-potential lead frame 36 is provided by the shunt resistor 20. The electric current supplied to the motor 80 is detected by detecting the electric current flowing in the shunt resistor 20.

As another example, the first connecting conductor that connects the upper arm MOS 61 and the motor lead frame 35 may be provided by the shunt resistor 20, and the electric current supplied to the motor 80 may be detected by detecting the electric current flowing in the shunt resistor 20.

In the fourth and fifth embodiment having the motor relay MOSs 67, 68, 69, the first connecting conductor and/or the second connecting conductor may be provided by the shunt resistor 20, in place of the third connecting conductor.

(5) The high-potential conductor, the low-potential conductor (load relay preceding conductor, load relay subsequent conductor), the low-potential conductor may include conductive electric lines in a printed board and a ceramic board, in addition to or alternative to the lead frames described above. The high-potential conductor, the low-potential conductor and the low-potential conductor are generally referred to as bus bars.

(6) The shunt resistor 20 may be connected to the MOS and the lead frame by a solder. As another example, the shunt resistor 20 may be connected to the MOS and the lead frame with a conductive adhesive. In such a case, it may not be necessary to consider the rising of the solder as shown in FIG. 5.

(7) In the embodiments described above, the electric current flowing in the shunt resistor 20 is detected by detecting voltages at both ends of the shunt resistor 20. However, a way of detecting the electric current is not limited to the described way. The electric current may be directly detected.

(8) The shunt resistors 70, 75 of the second and this embodiments may be employed in the inverter units 58, 59 of the fourth and fifth embodiments. Namely, the embodiments described above may be combined in various ways.

While only the selected exemplary embodiments have been chosen to illustrate the present disclosure, it will be apparent to those skilled in the art from this disclosure that various changes and modifications can be made therein without departing from the scope of the disclosure as defined in the appended claims. Furthermore, the foregoing description of the exemplary embodiments according to the present disclosure is provided for illustration only, and not for the purpose of limiting the disclosure as defined by the appended claims and their equivalents.

What is claimed is:

1. A semiconductor module comprising:
a plurality of switching elements each constituting an upper arm part or a lower arm part of a bridge circuit;
a high-potential conductor being coupled to a high-potential electrode of a power source, the switching element of the upper arm being disposed on the high-potential conductor;
a load conductor being coupled to a load, the switching element of the lower arm being disposed on the load conductor;
a low-potential conductor being coupled to a low-potential electrode of the power source;
a first connecting conductor having one end connected to the switching element of the upper arm disposed on the high-potential conductor and another end connected to the load conductor; and
a second connecting conductor having one end connected to the switching element of the lower arm disposed on the load conductor and another end connected to the low-potential conductor, wherein
at least one of the first connecting conductor and the second connecting conductor serves as a shunt resistor for detecting a magnitude of an electric current flowing between the one end and the another end of the at least one of the first connecting conductor and the second connecting conductor.

2. The semiconductor module according to claim 1, wherein
the at least one, which serves as the shunt resistor, is configured such that an end surface of the one end connected to the corresponding switching element is higher than an end surface of the another end by a level corresponding to a height of the corresponding switching element.

3. The semiconductor module according to claim 2, wherein the at least one, which serves as the shunt resistor, includes:
a first leg portion having the end surface of the one end being in contact with the corresponding switching element;
a second leg portion having the end surface of the another end;
a body portion connecting between the first leg portion and the second leg portion, the body portion being located higher than the first leg portion and the second leg portion, and
inclined portions connecting between the body portion and the first leg portion and between the body portion and the second leg portion.

4. The semiconductor module according to claim 3,
the at least one, which serves as the shunt resistor, is configured such that an upper surface of the first leg portion and an upper surface of the second leg portion are connected to sensor terminals for detecting the magnitude of the electric current through bonding wires.

5. A semiconductor module comprising:
a plurality of switching elements including a switching element constituting an upper arm of a bridge circuit, a switching element constituting a lower arm of the bridge circuit coupled to the upper arm at a coupling point, and a switching element constituting a load relay, the switching element constituting the load relay being connected between the coupling point and a load to electrically couples and decouples the coupling point to and from the load;
a high-potential conductor being coupled to a high-potential electrode of a power source, the switching element of the upper arm being disposed on the high-potential conductor;
a first load relay preceding conductor on which the switching element of the lower arm is disposed;
a first load relay subsequent conductor being coupled to the load, the switching element of the load relay being disposed on the first load relay subsequent conductor;
a low-potential conductor being coupled to a low-potential electrode of the power source;
a first connecting conductor having one end connected to the switching element of the upper arm disposed on the high-potential conductor and another end connected to the first load relay preceding conductor;
a second connecting conductor having one end connected to the switching element of the lower arm disposed on the first load relay preceding conductor and another end connected to the low-potential conductor; and
a third connecting conductor having one end connected to the switching element of the load relay disposed on the first load relay subsequent conductor and the another end connected to the first load relay preceding conductor, wherein
at least one of the first connecting conductor, the second connecting conductor, and the third connecting conductor serves as a shunt resistor for detecting a magnitude of an electric current flowing between the one end and the another end of the at least one of the first connecting conductor, the second connecting conductor and the third connecting conductor.

6. The semiconductor module according to claim 5, wherein
the at least one, which serves as the shunt resistor, is configured such that an end surface of the one end connected to the corresponding switching element is higher than an end surface of the another end by a level corresponding to a height of the corresponding switching element.

7. The semiconductor module according to claim 6, wherein
the at least one, which serves as the shunt resistor, includes:
a first leg portion having the end surface of the one end being in contact with the corresponding switching element;
a second leg portion having the end surface of the another end;
a body portion connecting between the first leg portion and the second leg portion, the body portion being located higher than the first leg portion and the second leg portion, and
inclined portions connecting between the body portion and the first leg portion and between the body portion and the second leg portion.

8. The semiconductor module according to claim 7, wherein
the at least one, which serves as the shunt resistor, is configured such that an upper surface of the first leg portion and an upper surface of the second leg portion are connected to sensor terminals for detecting the magnitude of the electric current through bonding wires.

9. A semiconductor module comprising:
a plurality of switching elements including a switching element constituting an upper arm of a bridge circuit, a switching element constituting a lower arm of the bridge circuit coupled to the upper arm at a coupling point, and a switching element constituting a load relay, the switching element constituting the load relay being connected between the coupling point and a load to electrically couples and decouples the coupling point to and from the load;
a high-potential conductor being coupled to a high-potential electrode of a power source, the switching element of the upper arm being disposed on the high-potential conductor;
a second load relay preceding conductor on which the switching element of the lower arm and the switching element of the load relay are disposed;
a second load relay subsequent conductor being coupled to the load;
a low-potential conductor being coupled to a low-potential electrode of the power source;
a first connecting conductor having one end connected to the switching element of the upper arm disposed on the high-potential conductor and another end connected to the second load relay preceding conductor;
a second connecting conductor having one end connected to the switching element of the lower arm disposed on the second load relay preceding conductor and another end connected to the low-potential conductor; and
a third connecting conductor having one end connected to the switching element of the load relay disposed on the second load relay preceding conductor and another end connected to the second load relay subsequent conductor, wherein
at least one of the first connecting conductor, the second connecting conductor, and the third connecting conductor serves as a shunt resistor for detecting an electric current flowing between the one end and the another end of the at least one of the first connecting conductor, the second connecting conductor and the third connecting conductor.

10. The semiconductor module according to claim 9, wherein
the at least one, which serves as the shunt resistor, is configured such that an end surface of the one end connected to the corresponding switching element is higher than an end surface of the another end by a level corresponding to a height of the corresponding switching element.

11. The semiconductor module according to claim 10, wherein
the at least one, which serves as the shunt resistor, includes:
a first leg portion having the end surface of the one end being in contact with the corresponding switching element;
a second leg portion having the end surface of the another end;
a body portion connecting between the first leg portion and the second leg portion, the body portion being located higher than the first leg portion and the second leg portion, and
inclined portions connecting between the body portion and the first leg portion and between the body portion and the second leg portion.

12. The semiconductor module according to claim 11, wherein
the at least one, which serves as the shunt resistor, is configured such that an upper surface of the first leg portion and an upper surface of the second leg portion are connected to sensor terminals for detecting the magnitude of the electric current through bonding wires.

* * * * *